(12) United States Patent
Dunn et al.

(10) Patent No.: US 11,203,312 B2
(45) Date of Patent: *Dec. 21, 2021

(54) SOLAR POWERED VEHICLE TOPPER UNIT

(71) Applicant: Manufacturing Resources International, Inc., Alpharetta, GA (US)

(72) Inventors: William Dunn, Alpharetta, GA (US); Jack Bartholmae, Duluth, GA (US); Douglas Bennett, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/001,895

(22) Filed: Aug. 25, 2020

(65) Prior Publication Data

US 2021/0061183 A1 Mar. 4, 2021

Related U.S. Application Data

(60) Provisional application No. 62/911,806, filed on Oct. 7, 2019, provisional application No. 62/892,104, filed on Aug. 27, 2019.

(51) Int. Cl.
*B60R 16/033* (2006.01)
*H05K 5/00* (2006.01)
(Continued)

(52) U.S. Cl.
CPC .............. *B60R 16/033* (2013.01); *B60K 6/24* (2013.01); *B60K 6/26* (2013.01); *B60K 6/28* (2013.01);
(Continued)

(58) Field of Classification Search
CPC ..... B60R 16/033; B60R 9/04; B60R 11/0229; B60R 13/00; B60R 11/02; H02S 10/40;
(Continued)

(56) References Cited

U.S. PATENT DOCUMENTS

| | | |
|---|---|---|
| 3,525,461 A | 8/1970 | Bronson |
| 3,978,599 A | 9/1976 | Berger |

(Continued)

FOREIGN PATENT DOCUMENTS

| | | |
|---|---|---|
| AU | 201815719 | 10/2018 |
| AU | 201815720 | 10/2018 |

(Continued)

OTHER PUBLICATIONS

Adnation, Miller photos, May 9, 2017, 28 pages.
(Continued)

*Primary Examiner* — Robert L Deberadinis
(74) *Attorney, Agent, or Firm* — Standley Law Group LLP; Jeffrey S. Standley; Adam J. Smith (57) ABSTRACT

A solar powered vehicle topper unit and systems and methods for the same are provided. A solar energy harvesting device is electrically connected to an electronic display within a housing. A support extends between the housing and the solar energy harvesting device such that a bottom surface of the solar energy harvesting device is located above, and spaced apart form, a top surface of the housing to secure the solar energy harvesting device in an elevated position. The solar energy harvesting device has a first footprint, and the housing has a second footprint which is smaller than the first footprint.

20 Claims, 9 Drawing Sheets

(51) Int. Cl.

| | |
|---|---|
| *H05K 7/20* | (2006.01) |
| *H02J 7/00* | (2006.01) |
| *B60R 11/02* | (2006.01) |
| *E04H 1/12* | (2006.01) |
| *H02J 3/38* | (2006.01) |
| *B60R 13/00* | (2006.01) |
| *H02S 10/40* | (2014.01) |
| *H02S 30/10* | (2014.01) |
| *H02S 40/38* | (2014.01) |
| *H02J 7/35* | (2006.01) |
| *B60L 58/10* | (2019.01) |
| *B60K 6/24* | (2007.10) |
| *B60K 6/26* | (2007.10) |
| *B60K 6/28* | (2007.10) |
| *B60R 9/04* | (2006.01) |
| *G09F 21/04* | (2006.01) |
| *H02S 20/10* | (2014.01) |
| *G09F 19/22* | (2006.01) |
| *G09F 9/33* | (2006.01) |
| *G09F 9/35* | (2006.01) |

(52) U.S. Cl.
CPC .......... *B60L 58/10* (2019.02); *B60R 9/04* (2013.01); *B60R 11/0229* (2013.01); *B60R 13/00* (2013.01); *E04H 1/1211* (2013.01); *G09F 19/22* (2013.01); *G09F 21/04* (2013.01); *H02J 3/381* (2013.01); *H02J 7/0068* (2013.01); *H02J 7/35* (2013.01); *H02S 10/40* (2014.12); *H02S 20/10* (2014.12); *H02S 30/10* (2014.12); *H02S 40/38* (2014.12); *H05K 5/0017* (2013.01); *H05K 7/202* (2013.01); *H05K 7/20172* (2013.01); *H05K 7/20954* (2013.01); *H05K 7/20972* (2013.01); *B60Y 2300/91* (2013.01); *B60Y 2400/112* (2013.01); *B60Y 2400/43* (2013.01); *B60Y 2400/60* (2013.01); *G09F 9/33* (2013.01); *G09F 9/35* (2013.01); *H02J 2300/24* (2020.01)

(58) Field of Classification Search
CPC .......... H02S 20/10; H02S 30/10; H02S 40/38; B60L 58/10; B60K 6/24; B60K 6/26; B60K 6/28; E04H 1/1211; E04H 1/12; G09F 19/22; G09F 21/04; G09F 9/33; G09F 9/35; H02J 3/381; H02J 17/0068; H02J 7/35; H02J 2300/24; H02J 7/00; H02J 3/38; H05K 5/0017; H05K 7/20172; H05K 7/202; H05K 7/20954; H05K 7/20972; H05K 5/00; H05K 7/20; B60Y 2300/91; B60Y 2400/112; B60Y 2400/43; B60Y 2400/60

See application file for complete search history.

(56) References Cited

U.S. PATENT DOCUMENTS

| | | |
|---|---|---|
| 4,052,806 A | 10/1977 | George |
| 4,114,789 A | 9/1978 | Blaylock et al. |
| 4,449,656 A | 5/1984 | Wouden |
| 4,500,020 A | 2/1985 | Rasor |
| 4,534,496 A | 8/1985 | Bott |
| 4,640,450 A | 2/1987 | Gallion et al. |
| 4,671,004 A | 6/1987 | Berg |
| D294,137 S | 2/1988 | Robson |
| D296,087 S | 6/1988 | Luck |
| 4,768,691 A | 9/1988 | Stapleton |
| 4,778,092 A | 10/1988 | Grace |
| D306,990 S | 4/1990 | Bott |
| 4,972,983 A | 11/1990 | Bott |
| 4,982,886 A | 1/1991 | Cucheran |
| D314,983 S | 2/1991 | Cangianni et al. |
| 4,993,615 A | 2/1991 | Arvidsson |
| 5,016,798 A | 5/1991 | Stapleton et al. |
| 5,038,988 A | 8/1991 | Thulin |
| D320,971 S | 10/1991 | Sparham et al. |
| 5,104,020 A | 4/1992 | Arvidsson et al. |
| D326,282 S | 5/1992 | Spoljaric |
| 5,132,666 A | 7/1992 | Fahs |
| 5,170,920 A | 12/1992 | Corrente et al. |
| 5,171,083 A | 12/1992 | Rich |
| 5,207,365 A | 5/1993 | Bott |
| 5,306,156 A | 4/1994 | Gibbs et al. |
| 5,347,736 A | 9/1994 | Kanigan |
| 5,385,285 A | 1/1995 | Cucheran et al. |
| 5,474,218 A | 12/1995 | Arsenault, Jr. et al. |
| 5,560,525 A | 10/1996 | Grohmann et al. |
| D398,409 S | 9/1998 | Jessa |
| 5,826,766 A | 10/1998 | Aftanas |
| 5,845,828 A | 12/1998 | Settelmayer |
| 5,871,190 A | 2/1999 | Henriksson |
| 5,979,723 A | 11/1999 | Tress et al. |
| 6,050,467 A | 4/2000 | Drouillard et al. |
| D430,901 S | 9/2000 | Palmer |
| 6,116,486 A | 9/2000 | Lindell |
| 6,378,747 B1 | 4/2002 | Fisch et al. |
| 6,415,970 B1 | 7/2002 | Kmita et al. |
| D486,188 S | 2/2004 | Norcross et al. |
| 6,701,143 B1 | 3/2004 | Dukach et al. |
| 6,812,851 B1 | 11/2004 | Dukach et al. |
| 6,850,209 B2 | 2/2005 | Mankins et al. |
| 7,134,764 B1 | 11/2006 | Bieberdorf |
| 7,434,713 B2 | 10/2008 | Linden |
| D634,722 S | 3/2011 | Kim et al. |
| D635,614 S | 4/2011 | Yan |
| D639,340 S | 6/2011 | Martin |
| D647,970 S | 11/2011 | Strempack |
| D654,116 S | 2/2012 | McDougall et al. |
| 8,122,628 B2 | 2/2012 | Johnson, Jr. |
| D657,421 S | 4/2012 | Yan |
| D657,422 S | 4/2012 | Yan |
| D669,938 S | 10/2012 | Lard et al. |
| D704,265 S | 5/2014 | Yan |
| 8,895,836 B2 | 11/2014 | Amin et al. |
| 9,121,391 B1 | 9/2015 | Koehler, III |
| 9,135,839 B2 | 9/2015 | Remenda |
| D740,472 S | 10/2015 | Linton et al. |
| D763,357 S | 8/2016 | Tsuru et al. |
| D765,660 S | 9/2016 | Kim et al. |
| 9,451,060 B1 | 9/2016 | Bowers et al. |
| 9,516,485 B1 | 12/2016 | Bowers et al. |
| D775,989 S | 1/2017 | Kalanick et al. |
| D777,258 S | 1/2017 | Strempack et al. |
| 9,622,392 B1 | 4/2017 | Bowers et al. |
| D793,890 S | 8/2017 | Hong |
| D815,690 S | 4/2018 | Squillante |
| 9,994,160 B2 | 6/2018 | Kim et al. |
| D848,528 S | 5/2019 | Lee et al. |
| D848,529 S | 5/2019 | Lee et al. |
| 10,326,962 B2 | 6/2019 | Hamilton |
| 10,486,618 B2 | 11/2019 | Hornsby et al. |
| D869,378 S | 12/2019 | Hornsby et al. |
| D878,467 S | 3/2020 | Hornsby et al. |
| D879,202 S | 3/2020 | Hornsby et al. |
| 2002/0009978 A1 | 1/2002 | Dukach et al. |
| 2002/0065046 A1 | 5/2002 | Mankins et al. |
| 2002/0084891 A1 | 7/2002 | Mankins et al. |
| 2002/0112026 A1 | 8/2002 | Fridman et al. |
| 2002/0164962 A1 | 11/2002 | Mankins et al. |
| 2003/0119448 A1 | 6/2003 | Arntz |
| 2004/0004827 A1 | 1/2004 | Guest |
| 2004/0036622 A1 | 2/2004 | Dukach et al. |
| 2004/0170013 A1 | 9/2004 | Smythe |
| 2004/0182898 A1 | 9/2004 | Harris |
| 2005/0116511 A1 | 6/2005 | Leroy et al. |
| 2006/0091170 A1 | 5/2006 | Almhil |
| 2007/0108243 A1 | 5/2007 | Bingham |
| 2007/0158965 A1 | 7/2007 | Van Smirren |
| 2008/0236007 A1 | 10/2008 | Au et al. |

(56) References Cited

U.S. PATENT DOCUMENTS

| | | |
|---|---|---|
| 2010/0079979 A1 | 4/2010 | Nakamichi et al. |
| 2010/0282799 A1 | 11/2010 | Hubbard |
| 2011/0072697 A1 | 3/2011 | Miller |
| 2011/0132946 A1 | 6/2011 | Sautter et al. |
| 2011/0298841 A1 | 12/2011 | Fujimori |
| 2011/0315726 A1 | 12/2011 | Huhn et al. |
| 2012/0002357 A1 | 1/2012 | Auld et al. |
| 2012/0061198 A1* | 3/2012 | Asatsuke ............... F16D 25/10 192/3.25 |
| 2012/0224116 A1 | 9/2012 | Barnes |
| 2012/0312848 A1 | 12/2012 | Delusky et al. |
| 2013/0098425 A1 | 4/2013 | Amin et al. |
| 2013/0173358 A1 | 7/2013 | Pinkus |
| 2014/0293605 A1 | 10/2014 | Chemel et al. |
| 2015/0129625 A1 | 5/2015 | Gorey et al. |
| 2015/0175082 A1 | 6/2015 | Aftanas et al. |
| 2015/0232038 A1 | 8/2015 | Robertson |
| 2015/0274084 A1 | 10/2015 | Sargès et al. |
| 2015/0369274 A1 | 12/2015 | Stojkovic et al. |
| 2015/0381922 A1 | 12/2015 | Hamilton |
| 2016/0041423 A1 | 2/2016 | Dunn |
| 2017/0029043 A1 | 2/2017 | Clark et al. |
| 2017/0050576 A1 | 2/2017 | Ferman |
| 2017/0111486 A1 | 4/2017 | Bowers et al. |
| 2017/0111520 A1 | 4/2017 | Bowers et al. |
| 2017/0132960 A1 | 5/2017 | Kis-Benedek Pinero et al. |
| 2017/0257978 A1 | 9/2017 | Diaz |
| 2018/0170270 A1 | 6/2018 | Bergman |
| 2018/0272959 A1 | 9/2018 | Hornsby et al. |
| 2018/0293921 A1 | 10/2018 | Margrill |
| 2019/0295386 A1 | 9/2019 | Roberts |
| 2020/0010025 A1 | 1/2020 | Hornsby et al. |
| 2020/0039450 A1 | 2/2020 | Hornsby et al. |
| 2020/0207284 A1 | 7/2020 | Hornsby et al. |
| 2021/0066923 A1 | 3/2021 | Dunn et al. |

FOREIGN PATENT DOCUMENTS

| | | |
|---|---|---|
| AU | 201815721 | 10/2018 |
| CA | 183485 | 12/2019 |
| CA | 183486 | 12/2019 |
| CA | 183487 | 12/2019 |
| CN | 106782121 A | 5/2017 |
| CN | 109961695 A | 7/2019 |
| DE | 202007017477 U1 | 6/2008 |
| EM | 005638509-0001 | 9/2018 |
| EM | 005638541-0001 | 9/2018 |
| EM | 005638558-0001 | 9/2018 |
| EP | 0476288 A1 | 3/1992 |
| EP | 3602534 A1 | 2/2020 |
| JP | 2012-16086 A | 1/2012 |
| JP | 2012-255847 A | 12/2012 |
| JP | 1634158 S | 5/2019 |
| JP | 1634159 S | 5/2019 |
| JP | 1660382 S | 5/2020 |
| KR | 10-0917344 B1 | 9/2009 |
| KR | 10-1444022 B1 | 10/2014 |
| KR | 30-1045258 | 2/2020 |
| KR | 30-1045259 | 2/2020 |
| KR | 30-1045260 | 2/2020 |
| WO | 2018/175888 A1 | 9/2018 |
| WO | 2021/041381 A1 | 3/2021 |

OTHER PUBLICATIONS

LG-MRI, BoldVu Vehicle Top Displays, via Internet Archive Wayback Machine at URL: https://web.archive.org/web/20190327001140/https://lg-mri.com/digital-taxi-top-display/, Mar. 27, 2019, 8 pages.

McGarryBowen, Inside the Campaign: United Airlines "Real Time Taxi", https://www.aaaa.org/inside-campaign-united-airlines-real-time-taxi-mcgarrybowen-media-partners-kinetic-mec-verifone/, Jul. 7, 2017, 6 pages, American Association of Advertising Agencies.

Rave, DSE 2017: LG-MRI Presents TaxiVu, a Digital LCD Display for Mobile Advertising, video at https://www.youtube.com/watch?v=CmNw40BT6ZE, Mar. 30, 2017, 1 page.

Rave, DSE 2018: LG-MRI Highlights BoldVu Vehicle Top Display, VT1145LD, for DOOH Advertising, video at https://www.youtube.com/watch?v=IYSMhCnMyhg, Apr. 1, 2018, 1 page.

Adnation, Turn Key Solutions, May 23, 2017, 4 pages.

Gizmodo, Uber Will Puts Ads on Top of Vehicles Just Like Old-School Taxis, Feb. 24, 2020, 4 pages.

The Street, Lyft Acquires Halo Cars, a Startup That Places Ads on Vehicles, Feb. 21, 2020, 2 pages.

Marketingdive, Puma brings targeted hologram ads to car roofs for NBA All-Star game, Feb. 20, 2020, 3 pages.

Deploy Solution, Melford Technologies homepage, Mar. 3, 2020, 4 pages.

Commercial Integrator, WaiveCar Brings Car Sharing and Digital Signage Together with Help from BrightSign, Jul. 6, 2018, 9 pages.

Vertical Digital Displays, Innovation on Display FlexVu Totem Brochure, 2014, 6 pages.

Vertigo Digital Displays, FlexVu Totem Shelter, 2017, 2 pages.

Vertical Digital Displays, All Products Cataogue, 2017, 14 pages.

Vertical Digital Displays, FlexVue Ferro 55P/55L, Mar. 16, 2017, 4 pages.

CIVIQ Smartscapes, There are companies that make kiosks. And then there's CIVIQ.—Advanced Smart City Platform, webpage, Jan. 30, 2019, 10 pages.

CIVIQ Smartscapes, Connecting people, places & experiences, webpage, Jan. 30, 2019, 5 pages.

CIVIQ Smartscapes, Connecting people, places & experiences, screen shot of devices webpage, Jan. 30, 2019, 1 page.

Manufacturing Resources International, Manufacturing Resources International home webpage, Nov. 4, 2019, 2 pages.

Manufacturing Resources International, LCD Display Deployments webpage, Nov. 4, 2019, 3 pages.

Manufacturing Resources International, BoldVu Outdoor LCD Display webpage, Nov. 4, 2019, 2 pages.

Manufacturing Resources International, BoldVu Semi Outdoor LCD Display webpage, Nov. 8, 2019, 2 pages.

Manufacturing Resources International, BoldVu Vehicle Top LCD Display webpage, Nov. 8, 2019, 2 pages.

Manufacturing Resources International, Drivethru Menu Boards Webpage, Nov. 8, 2019, 2 pages.

Manufacturing Resources International, Storefront Digital Signage webpage, Nov. 8, 2019, 2 pages.

Melford Technologies, Part 1, video online at https://m.youtube.com/watch?v=OAV7zzVrHtE&feature=youtu.be, Oct. 21, 2019, 1 page.

* cited by examiner

SOLAR POWERED VEHICLE TOPPER UNIT

CROSS-REFERENCE TO RELATED APPLICATIONS

This application claims the benefit of U.S. Provisional Application No. 62/892,104 filed on Aug. 27, 2019 and U.S. Provisional Application No. 62/911,806 filed Oct. 7, 2019, the disclosures of each of which are hereby incorporated by reference as if fully restated herein.

TECHNICAL FIELD

Exemplary embodiments relate generally to vehicle topper units ("VTUs") with solar panels.

BACKGROUND AND SUMMARY OF THE INVENTION

Electronic displays are increasingly replacing physical billboards, bulletins, posters, flyers, banners, and other physical signage for public announcements, advertising, and the like. It is known to provide such physical signage along sidewalks, along roadsides, at bus shelters, on poles, at drive throughs, on VTUs, and the like. Ruggedized displays have also commonly been provided for indoor, outdoor, and semi-outdoor use. Such electronic display assemblies may protect the electronic displays and related components from the elements, vandalism, theft, and the like. Exemplary examples of such displays may include those available from Manufacturing Resources International, Inc. of Alpharetta, Ga. (https://mri-inc.net/). These displays may be provided on sidewalks, on the ground, in windows, at bus shelters, at drive throughs, on the tops of vehicles, and the like to replace physical signage.

Advancements in solar energy are making solar panels more compact and efficient. Electronic display assemblies require power for operation. For example, such electronic display assemblies utilize lights, electronic displays, fans and other cooling equipment, electrical circuitry, and other electrically powered equipment which requires electrical power for operation. For ground mounted units, such power is generally provided by the electrical grid. In the case of VTUs, however, such power is generally provided by the vehicle. While VTUs may provide an extra source of revenue for vehicle drivers or companies, generally by displaying advertising for others, the extra weight of a VTU may reduce fuel efficiency, which negates some or all of the extra revenue. What is needed is a solar powered VTU.

Systems and methods for solar powered VTUs are disclosed herein. The VTU may be configured for outdoor use atop a vehicle such as, but not limited to, a taxi cab, a personal vehicle, a commercial vehicle, a limousine, a town car, a bus, an SUV, a rideshare vehicle, or the like. The VTU may comprise two electronic displays placed in a back-to-back arrangement, though any number, type, size, and orientation of electronic displays may be utilized.

One or more supports may extend between the VTU and one or more solar energy harvesting devices such that the one or more solar energy harvesting devices are elevated above a housing for VTU. This may provide the clearance needed for the performance of maintenance efforts on the electronic display assembly, such as the ability to open various access panels of the VTU.

The elevation of the one or more solar energy harvesting devices may also cast shade on various components of the VTU, such as but not limited to, one or more of the electronic displays. This may improve the contrast of images displayed on the electronic display(s), and may also lower brightness requirements, thereby reducing cooling needs. For example, without limitation, fans may be run at lower speeds or not at all. In exemplary embodiments, the one or more solar energy harvesting devices may be longer and/or wider than the VTU to provide shade. This may also increase the available area for solar power. Any number, size, type, location, and orientation of such solar energy harvesting devices may be utilized.

Power generated by the solar energy harvesting devices may be used to power the VTU, or select components thereof, when conditions are sufficiently sunny. Excess energy may be stored at one or more energy storage devices. In exemplary embodiments, the energy storage devices may be batteries within the VTU or the vehicle. When the power generated by the one or more solar energy harvesting devices is insufficient to power the VTU, or select components thereof, energy may be drawn from the one or more energy storage devices.

For example, without limitation, when a gasoline or other like powered vehicle is idle, the engine is often shut off. This results in shutting down the alternator and powering any electrical equipment, such as the VTU, by draining power from the vehicle battery. Of course, with electrically powered vehicles, as another example without limitation, powering any electrical device requires draining charge from the batteries. With the present invention, the VTU could be partially or wholly powered by the solar energy harvesting devices. Excess energy may be used to charge the vehicle battery.

The shade cast by the solar energy harvesting devices may also cool the interior of the vehicle, reducing the need to run air conditioning. This may provide increased efficiency.

Often times, vehicle drivers are required to return their vehicle with a full amount of fuel (such as but not limited to, a full tank of gas, a full battery charge, some combination thereof, or the like). The power supplied by the solar energy harvesting devices and/or the efficiency gains experienced by the shade cast by the solar energy harvesting devices may be sufficient to negate some or all of the fuel efficiencies losses experienced from addition of the VTU, and/or exceed the fuel efficiencies losses such that fuel efficiency is improved. Thus, the use of such solar energy harvesting devices may reduce the environmental impact of such electronic display assemblies.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary VTU 10. The VTU 10 may be employed to display information to the public along public roadways, such as, for example, advertisements, public service announcements and the like. Further, the VTU 10 may be fabricated in any size and shape, may be mounted to a vehicle 12 directly or indirectly, and may be mounted in any orientation (e.g., parallel to the longitudinal dimension of the vehicle 12, angled, and/or otherwise). Further, while the VTUs 10 of FIGS. 1-7 are shown as being mounted to the roof 13 of a vehicle 12, the VTUs 10 may be mounted to other portions of the vehicle 12 (e.g., hood and/or trunk) as well.

The vehicle 12 may be gasoline powered, hybrid powered (e.g., gasoline and electric), diesel powered, electric powered, fuel cell powered, hydrogen powered, human powered, some combination thereof, and/or the like. Further, the vehicle 12 may be any type of vehicle, including for example without limitation, a personal vehicle, a commercial vehicle, a rideshare vehicle, a taxi cab, a limousine, a town car, a bus, an SUV, a sedan, trailer, bus, motorcycle, scooter, tricycle, or the like.

As shown, the VTU 10 may be indirectly mounted to a vehicle 12 by way of a mounting system 14. The mounting system 14 may comprise one or more crossbars 16. The crossbars 16 may be configured for securement to a roof 13 of a vehicle 12. The crossbars 16 may be fabricated in any size, shape (e.g., cross-section), and type. The crossbars 16 may be configured to provide a sufficient degree of strength and rigidity to securely support the VTU 10.

The mounting system 14 may further comprise one or more bolts, screws, brackets, fasteners, adapters, some combination thereof, or the like for mounting the VTU 10 to the crossbars 16 (e.g., mounting the VTU housing 20 to the crossbars 16) and/or the crossbars 16 to the vehicle 12. Alternatively, or additionally, adhesive, welding, bonding, some combination thereof, or other joining techniques may be utilized.

One or more supports 36, which may vary in terms of size and shape (e.g., substantially rectangular), may be provided. The supports 36 may extend vertically between the housing 20 and each of one or more solar energy harvesting devices 24 to elevate a bottom surface of the solar energy harvesting devices 24 from an upper surface of the VTU 10. Doing so may facilitate access to the VTU 10, which may be useful for maintenance and servicing efforts. In one example, the supports 36 may be mounted to the housing 20 at a first end. The supports 36 may be mounted to lifting eyes located on the housing 20. In other exemplary embodiments, the supports 36 may extend into or through some or all of the housing 20 and may be mounted to one or more internal structural components of the VTU 10 and/or one or more components of the mounting system 14 (e.g., onto the crossbars 16). In exemplary embodiments, a first support 36 may be placed on a proximal portion of the VTU 10, and a second support 36 may be placed on a distal portion of the VTU 10. Other quantities and arrangements of supports 36 may also be utilized. The mounting of the supports 36, and/or other components described herein, may be performed by fasteners (such as but not limited, to rivet nuts, bolts, screws, nails, some combination thereof, or the like), adhesives, welding, bonding, some combination thereof, or the like.

In some non-limiting examples, the VTU 10 may comprise one or more side assemblies 22. Each side assembly 22 may comprise an electronic display 18. Each side assembly 22 may be configured to swing or otherwise rotate, pivot, or move outwardly to facilitate access to the components located inside the side assembly 22 and/or other portions of the VTU 10, which may include signage, cooling pathways, lights, fans, electronic displays, mounting components, structural components, electrical circuitry, various electronics for operating the VTU 10 and/or the solar energy harvesting device 24, some combination thereof, or the like. Each side assembly 22 may comprise an electronic display layer, a transparent cover panel, a backlight, some combination thereof, or the like. The backlight may comprise direct backlighting, edge lighting, some combination thereof, or the like. In other exemplary embodiments, a separate backlight may not be required as the electronic display 18 may be an emissive type display, such as but not limited to organic light emitting diode type displays. The electronic display 18 may be any type of electronic display such as, but not limited to, liquid crystal, organic light emitting diode, light emitting diode, cathode ray tube, plasma, some combination thereof, or the like.

In exemplary embodiments, at least 5 inches of clearance may be provided between an upper surface of the VTU 10 and a lower surface of the solar energy harvesting device 24, though any distance, or varying distances, may be utilized. This clearance may be provided to facilitate the casting of shade on the electronic display 18, the VTU 10, the interior of the vehicle 12, some combination thereof, or the like, thereby preventing the VTU from experiencing excessive solar (e.g., thermal) loading and/or to provide certain desirable aerodynamic effects.

Stiffeners 34 may be provided. The stiffeners 34 may extend horizontally along a lower surface of the substrate 32. The stiffeners 34 may extend from either side of each of the one or more supports 36. The stiffeners 34 shown extend substantially across the entire width $W_2$ of the solar energy harvesting device 24, but this is not required. In exemplary embodiments, the stiffeners 34 may be sandwiched between an upper surface of each of the one or more supports 36 and a lower surface of the substrate 32. The stiffeners 34 may be provided under some or all of the solar energy harvesting device 24 and may provide structural stability, strength, and/or rigidity.

In exemplary embodiments, the solar energy harvesting device 24 may be substantially rectangular in shape, though other shapes are also contemplated. The solar energy harvesting device 24 may have a width $W_2$ that is greater than the width $W1$ of the housing 20. Alternatively, or additionally, the solar energy harvesting device 24 may have a length $L_2$ that is greater than the length $L_1$ of the housing 20. The width dimensions $W_1$, $W_2$ and the length dimensions $L_1$, $L_2$ may be maximum width and length dimensions, respectively, for the solar energy harvesting device 24 and the housing 20, respectively. Stated another way, the solar energy harvesting device 24 may have a larger footprint than the footprint of the housing 20. This may provide for increased surface area for collecting solar energy. This may, additionally or alternatively, shade some or all of the housing 20, various components thereof (such as but not limited to the electronic display 18), and/or the vehicle 12 when placed in outdoor environments. Such shade may result in better image quality, including, but not limited to, improvised color saturation, contrast, some combination thereof, or the like. This may reduce the brightness levels needed to drive the electronic displays 18, thus resulting in reduced cooling needs. The shade may also decrease the solar loading experienced by the VTU 10, thus reducing cooling needs.

Those skill in the art will appreciate that any size, shape, number, type, and orientation of the solar energy harvesting device 24 may be utilized without departing from the scope of the present disclosure. While L1, L2, W1, and W2 may represent maximum dimensions, one or more of L1, L2, W1, and/or W2 may represent minimum dimensions. For example, without limitation, the minimum dimensions of the solar energy harvesting devices 24, W2 and/or L2, may be greater than the maximum dimensions of the housing 20, W1 and/or L1.

The solar energy harvesting device 24 may comprise one or more photovoltaic cells 28. The photovoltaic cells 28 may be mounted to one or more substrates 32. Normally, the photovoltaic cells 28 and/or the substrate 32 may comprise rough edges. A side edge 26 may be provided around an outer edge of the photovoltaic cells 28 and/or the substrate 32. The side edge 26 may provide a smoother surface which is safer for pedestrian interaction and is more aesthetically appealing.

One or more antenna 30 may be provided at the solar energy harvesting device 24. The antenna 30 may be configured to receive and/or transmit radio signals, cellular signals, GPS or other location tracking signals, Bluetooth® or other near field communication signals, some combination thereof, or the like. The antenna(s) 30 may be mounted to the substrate 32, wherein a first antenna 30 may be provided on a front portion of the substrate 32 and a second antenna 30 may be provided on a rear portion of the substrate 32. These antenna(s) 30 may be centered with respect to the side edges of the substrate 32. While any number and position of antenna 30 may be utilized, the configuration of antenna(s) 30 shown may minimize obstructions, thereby improving the transmission and/or receipt of signals.

One or more cameras 44 may be provided at the solar energy harvesting device 24. The cameras 44 may be mounted to the substrate 32. In exemplary embodiments, a first and second camera 44 may be provided on the left and right sides of the substrate 32, respectively, and may be centered from the front to the back (though any number and positioning of the cameras 44 may be utilized). In other exemplary embodiments, the camera 44 may be positioned on a distal end of one or more of the stiffeners 34. Other quantities and positions of the camera(s) 44 may also be utilized without departing from the scope of the present disclosure. In one non-limiting embodiment, the camera(s) 44 may be in electronic communication with the antenna 30 (though such is not required) so that images and/or video may be transmitted to an interested party. In operation, this may be performed for one or more of a variety of difference purposes, such as, but not limited to, determining which advertisements and/or public service announcements may be appropriate based on the demographics of the people nearby. Additionally, or alternatively, this data may even be used to turn off the electronic displays 18 remotely.

The solar energy harvesting device 24 may be in electrical connection with various components of the VTU 10, such as but not limited to, the electronic displays 18 one or more energy storage devices 38. Additionally, or alternatively, the solar energy harvesting device 24 may be in electrical connection with one or more energy sources 40. The energy storage device 38 may comprise one or more batteries. The energy sources 40 may comprise one or more batteries, alternators, some combination thereof, or the like. In exemplary embodiments, the energy storage device 38 and the energy source 40 may be one and the same, though such is not required.

A controller 42 may be interposed between one or more of: the solar energy harvesting device 24, the VTU 10, the energy storage device 38, and the energy source 40. The controller 42 may be configured to determine when to draw power from the energy storage device 38 and/or the energy source 40, and when to supply excess energy from the solar energy harvesting device 24 to the energy storage device 38.

While certain components, such as but not limited to, the energy storage device 38, the energy source 40, and the controller 42 are illustrated as being located outside of the VTU 10 and the solar energy harvesting device 24, such components may be, partially or entirely, internal to the VTU 10 and/or the solar energy harvesting device 24. In other words, such components may be placed at any location.

The VTU 10 may comprise one or more sensors 11 such as, but not limited to, temperature sensors, fan speed sensors, ambient light sensors, accelerometers, some combination thereof, or the like. In this way, the amount of cooling, the brightness of the electronic displays 18, the speed of the fans, some combination thereof, or the like may be adjusted based on ambient temperature, vehicle 12 movement, ambient lighting conditions (including but not limited to the amount of shade cast), some combination thereof, or the like. Where wireless connectivity is utilized, data may be collected by these sensors 11 and may be transmitted to one or more remote parties and/or locations where this type of data is desired.

Figure 1:
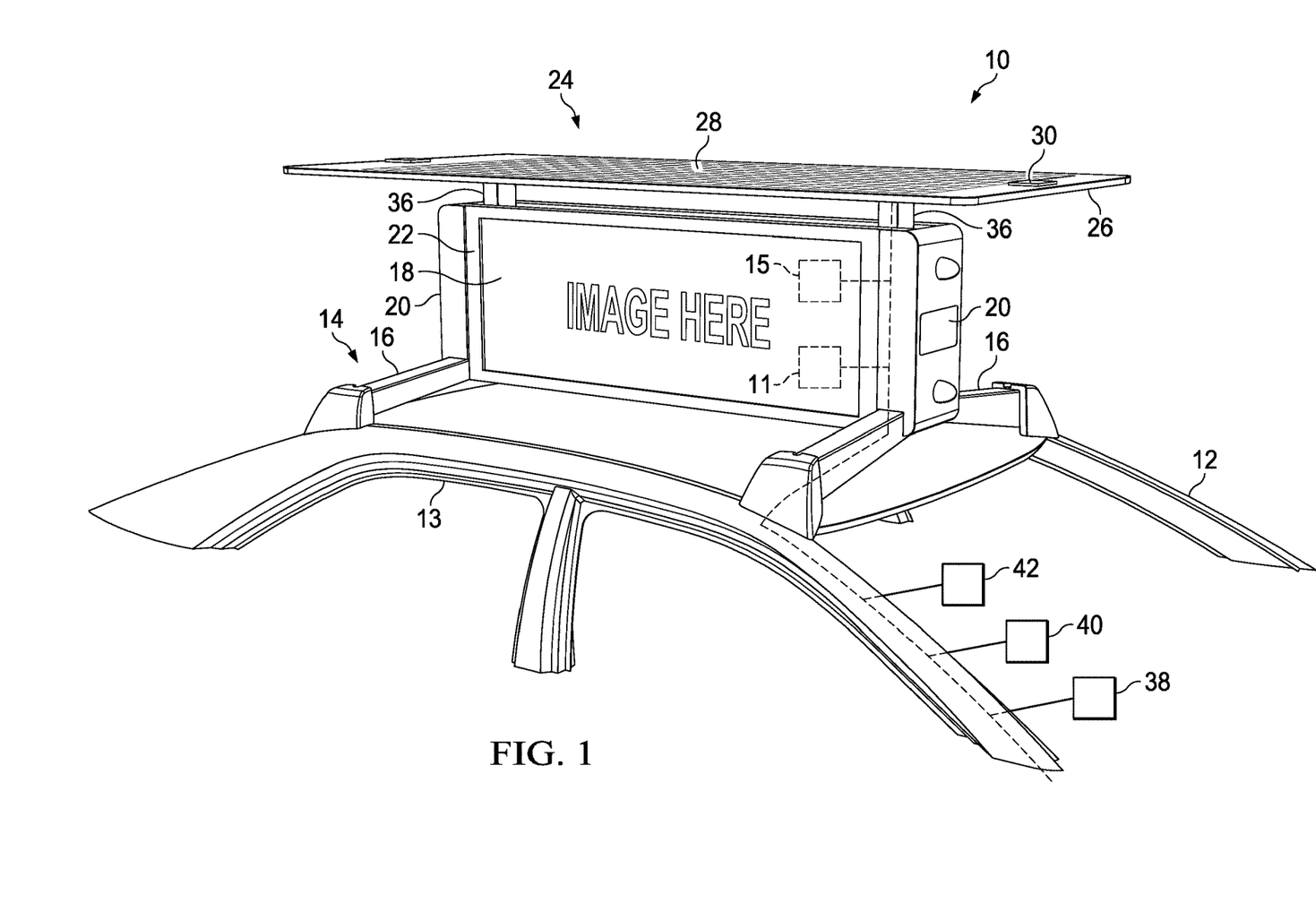
FIG. 1 is a front perspective view of an exemplary VTU with an exemplary solar energy harvesting device with certain internal components revealed and illustrated in simplified form.
Figure 2:
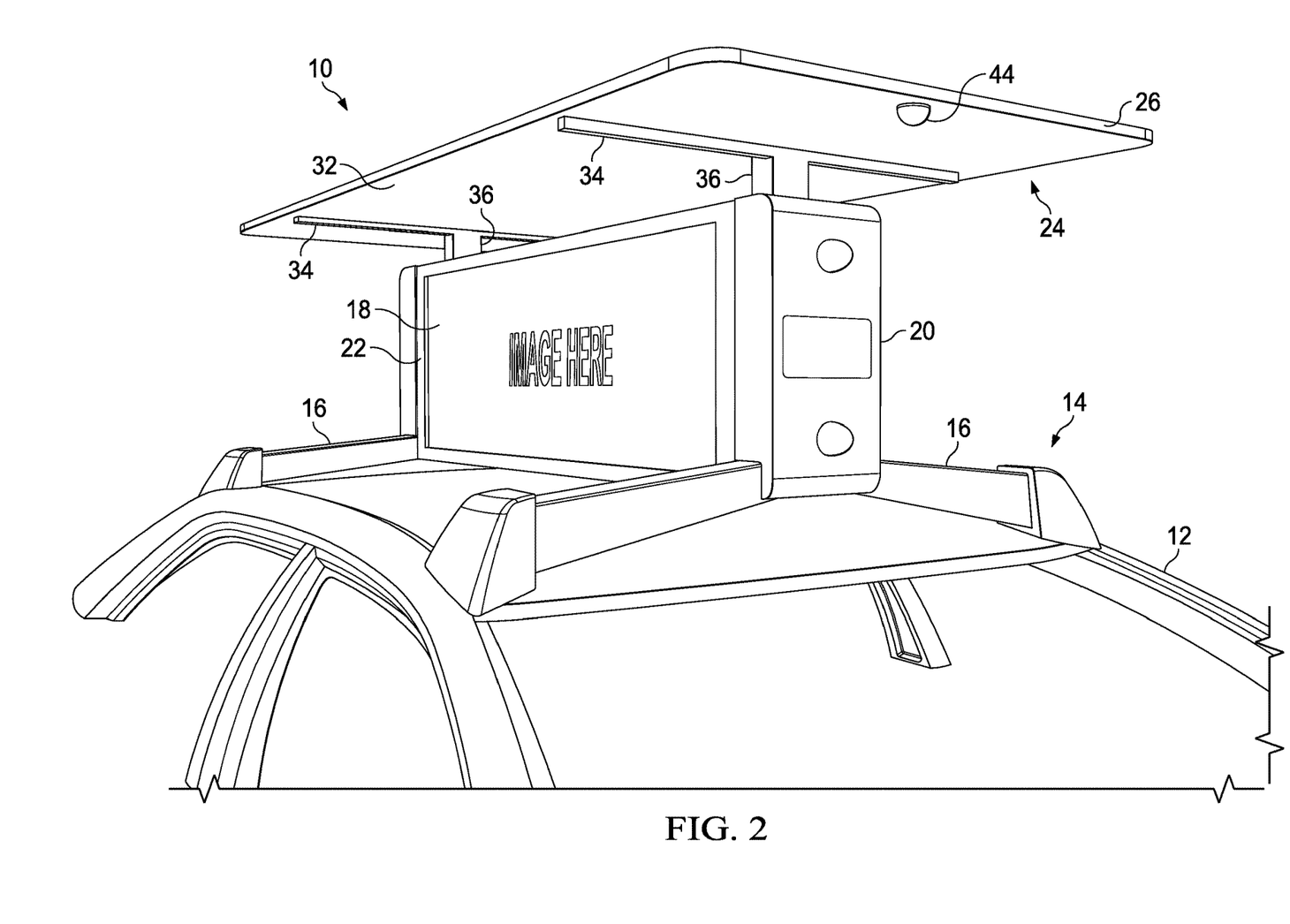
FIG. 2 is a left side perspective view of the VTU of FIG. 1.
Figure 3:
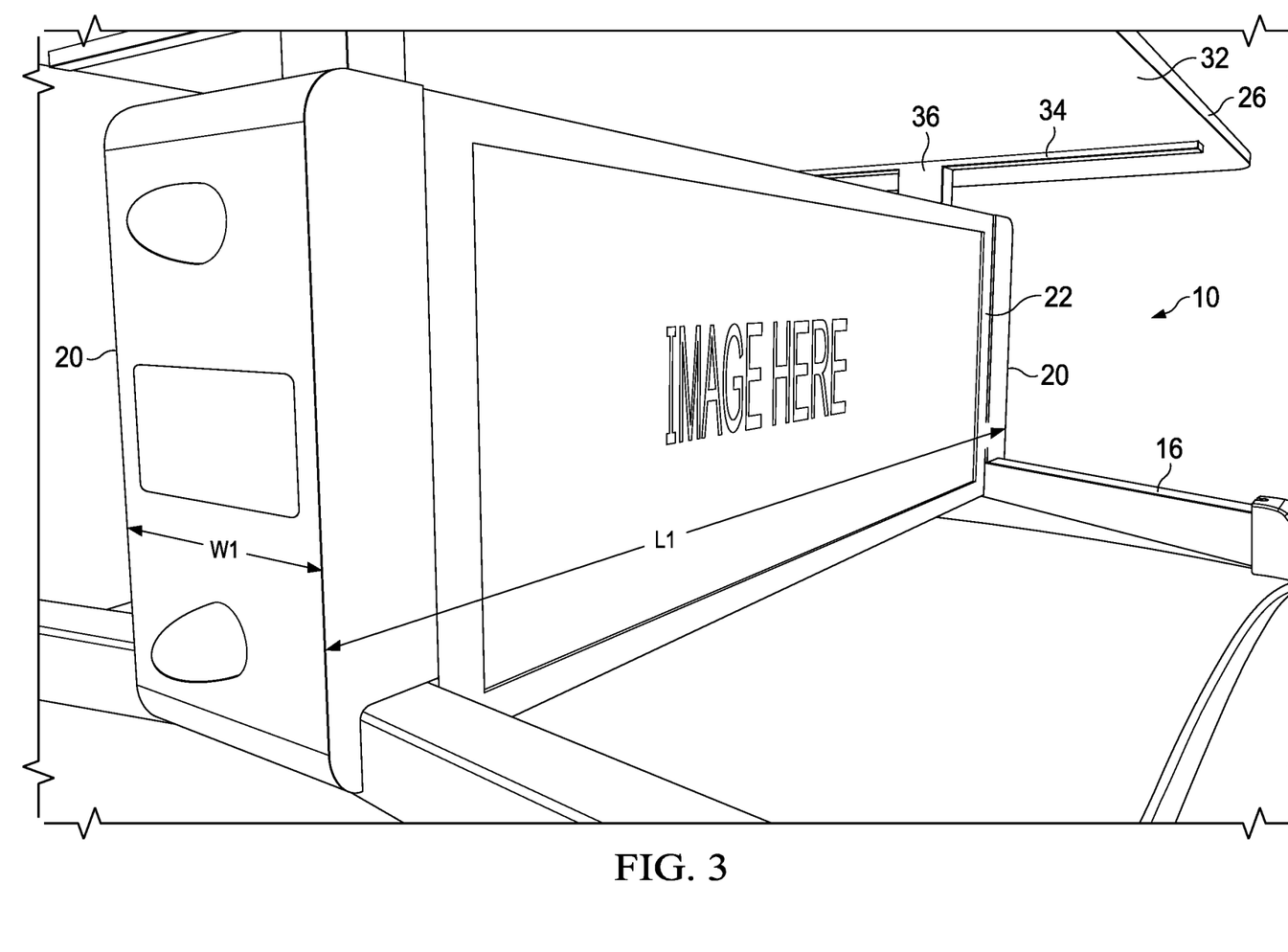
FIG. 3 is an enlarged, right side perspective view of the VTU of FIG. 1.
Figure 4:
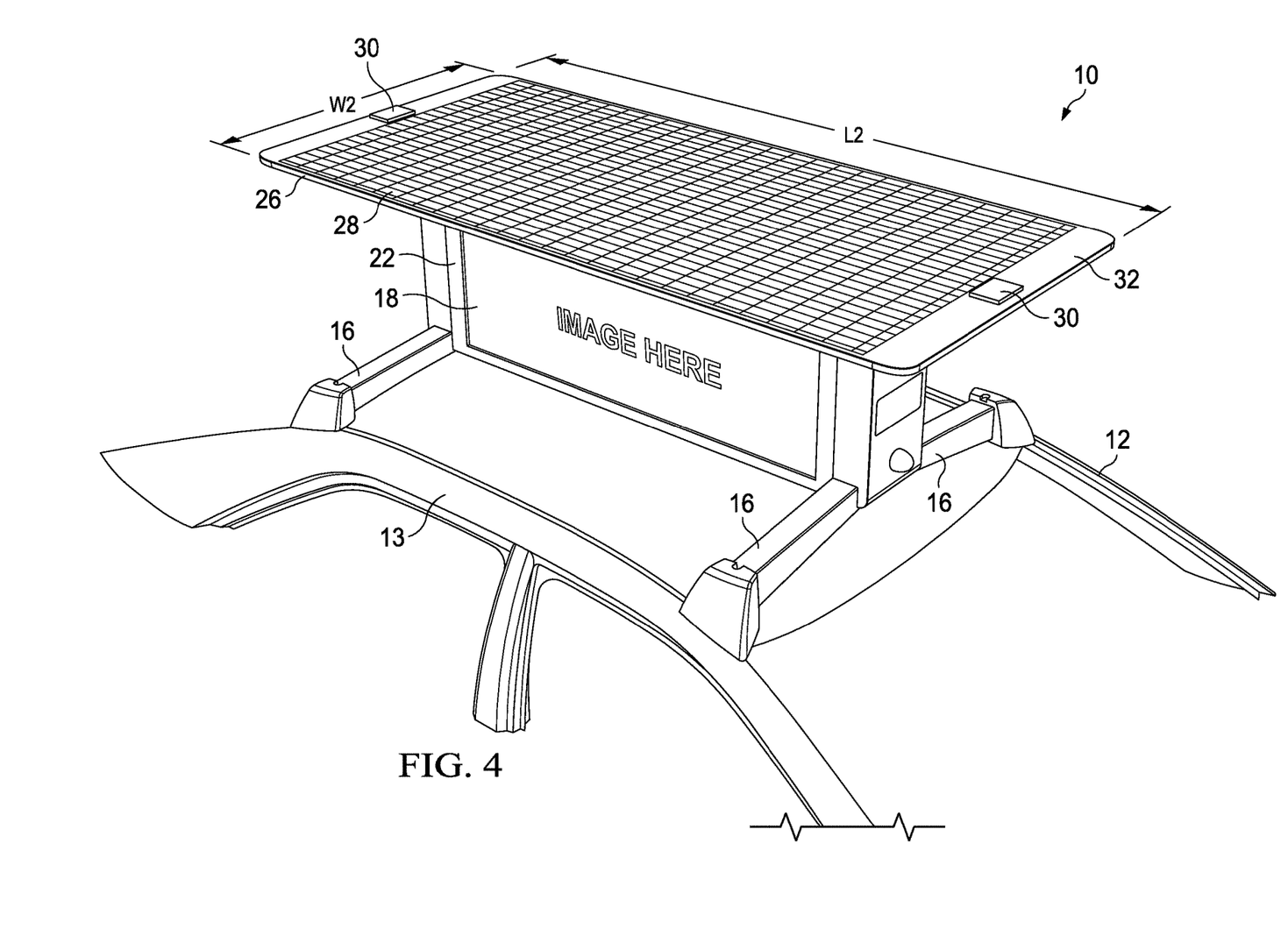
FIG. 4 is a top perspective view of the VTU of FIG. 1.
Figure 5:
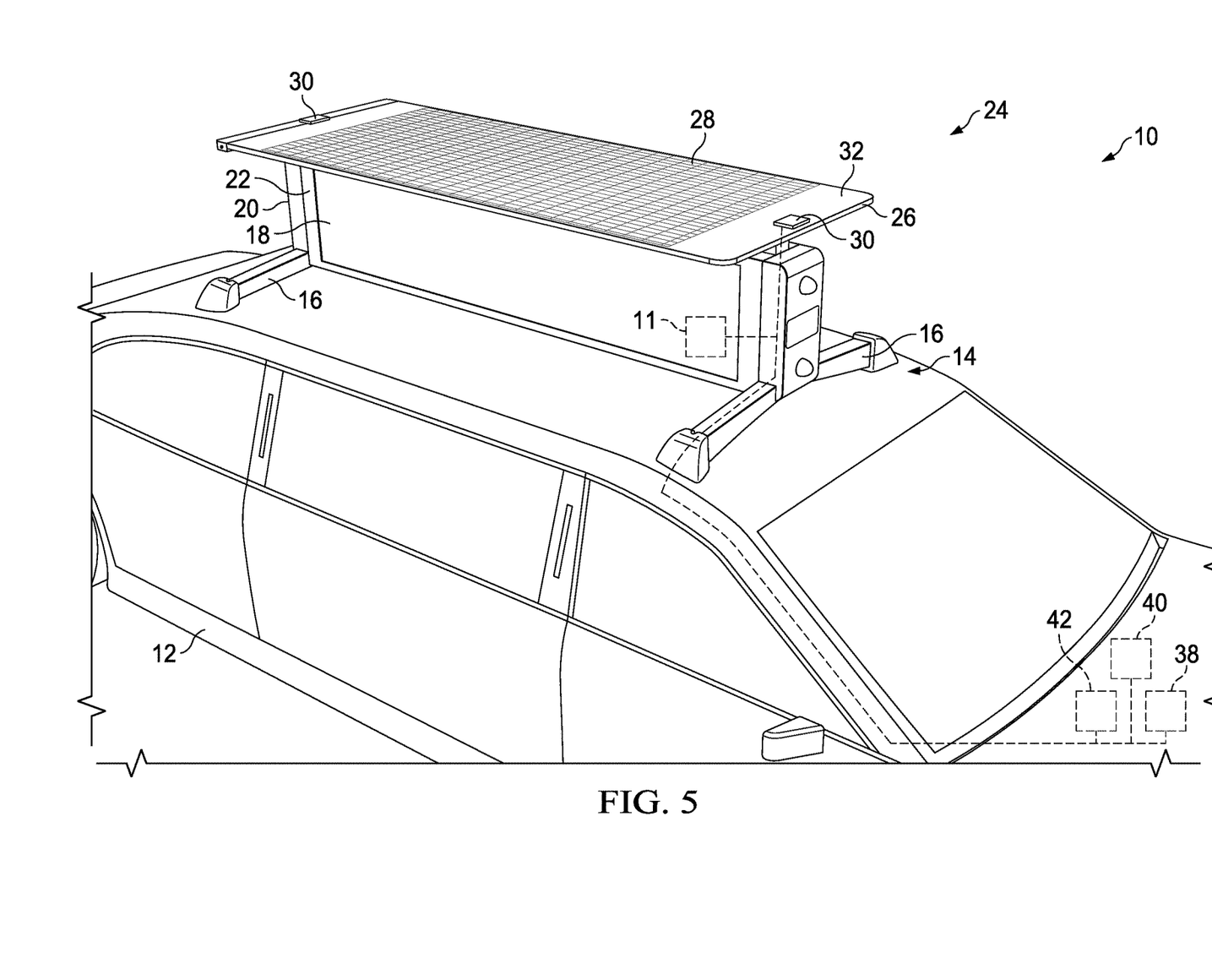
FIG. 5 is a front perspective view of another exemplary VTU with another exemplary solar energy harvesting device with certain internal components revealed and illustrated in simplified form.
Figure 6:
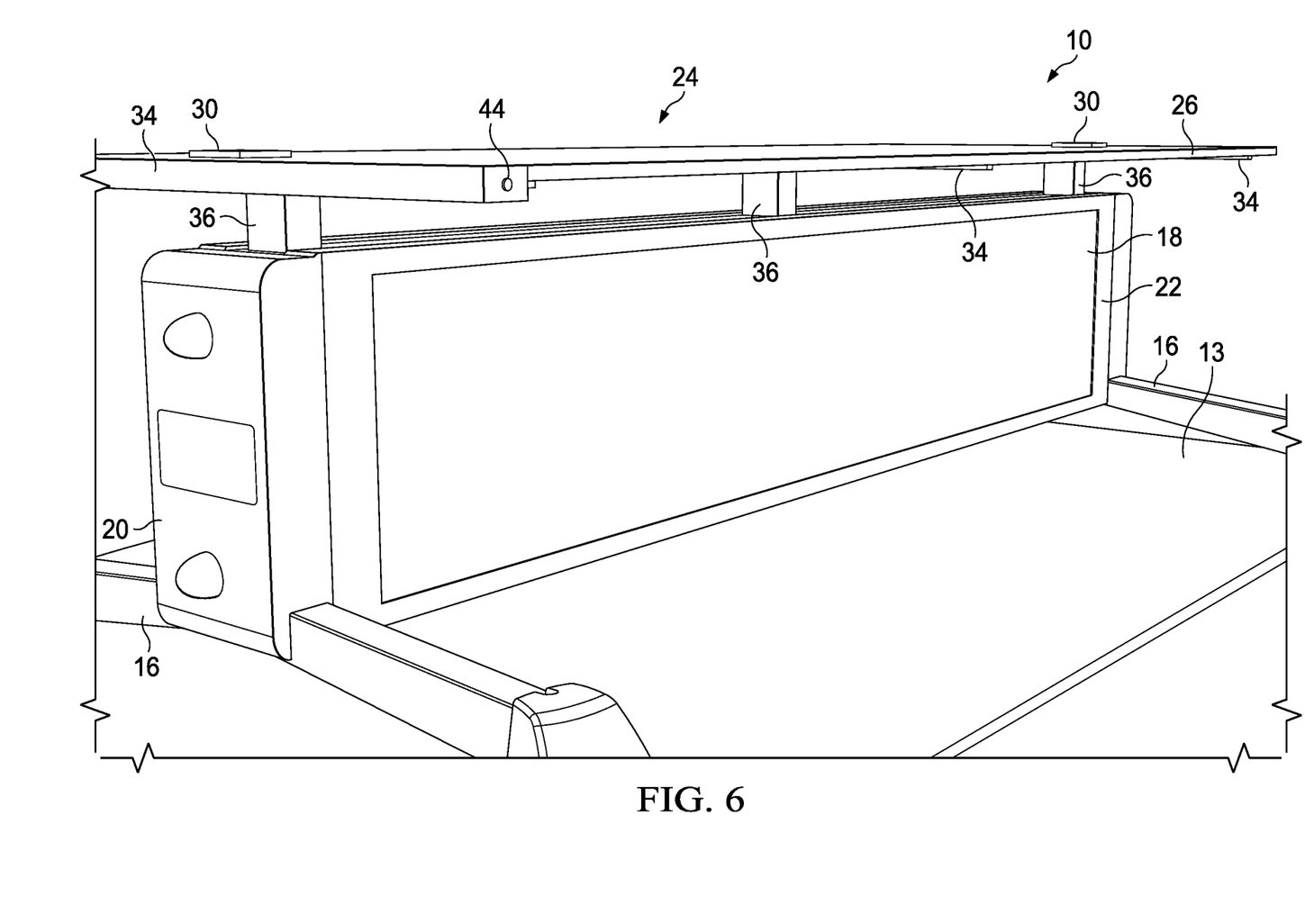
FIG. 6 is an enlarged, right side perspective view of the VTU of FIG. 5.
Figure 7:
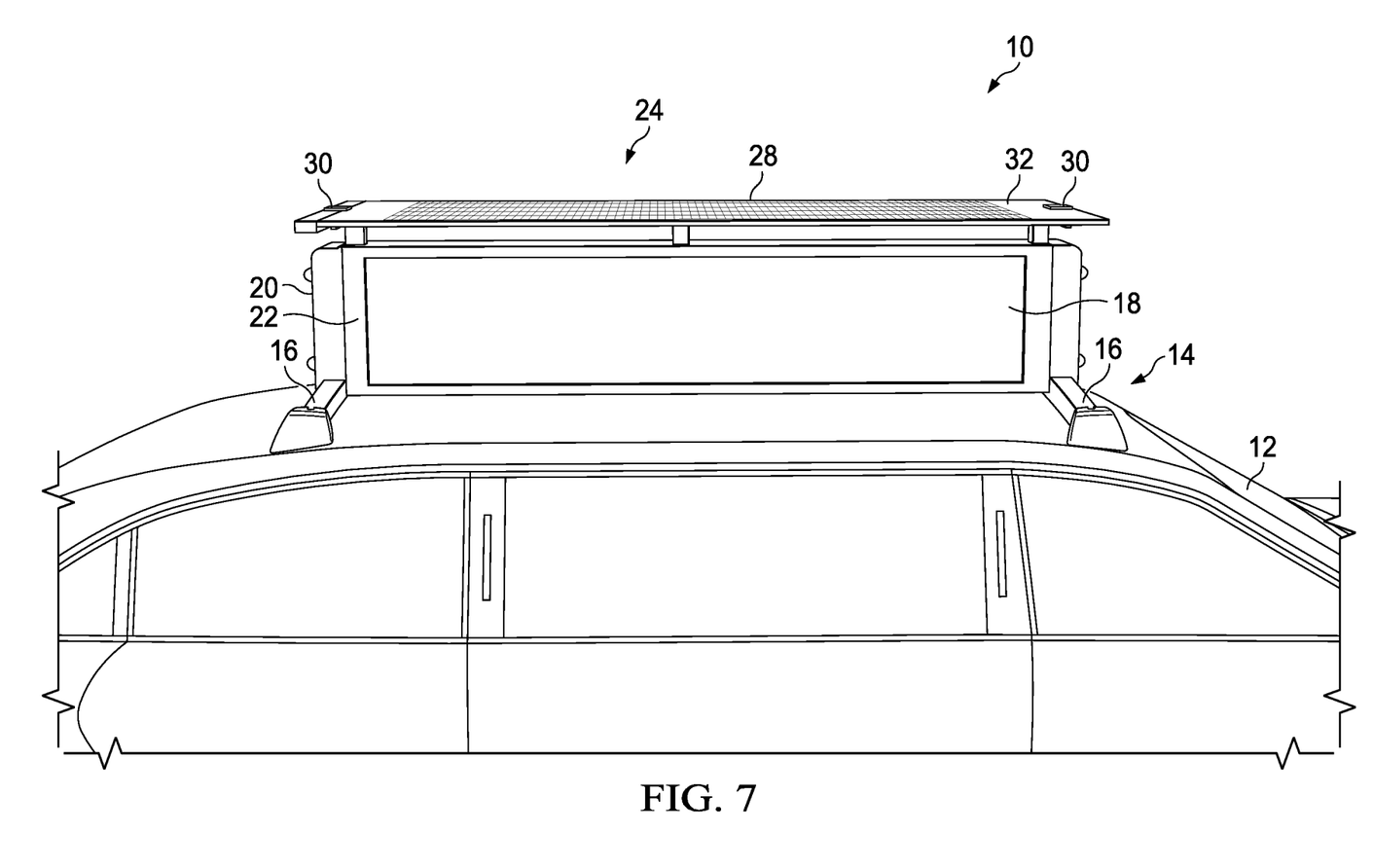
FIG. 7 is a left side view of the VTU of FIG. 5.

FIG. 5 through FIG. 7 illustrate another exemplary VTU 10. The VTU 10 may have an elongated shape, which may be better suited for particularly long vehicles 12, such as but not limited to, limousines, buses, RVs, trailers, and/or the like. In such embodiments, an elongated solar energy harvesting device 24 may be provided with multiple supports 36 to ensure that the solar energy harvesting device 24 (which may also be elongated) is adequately supported. In other exemplary embodiments, multiple solar energy harvesting devices 24 may be provided in a substantially linear fashion along the VTU 10. Those skilled in the art will appreciate, however, that any size, number, and arrangement of electronic display 18 and/or solar energy harvesting devices 24 may be utilized for any size and type of vehicle 12 without departing from the scope of the present disclosure.

The VTU 10 may be substantially rectangular in shape, though VTUs 10 of other sizes and/or shapes may be also utilized. Similarly, the solar energy harvesting devices 24 may be provided in any size, shape, orientation (e.g., flush or mounted at an angle), number, type (e.g., opaque, transparent, or translucent panels), composition (e.g., comprising one or more photovoltaic cells) and/or the like. Further, some or all of the solar energy harvesting devices 24 may even be configured to swivel, pivot, tilt, rotate, some combination thereof, and/or the like. Such movement may be accomplished manually or automatically, such as by motor and controller configured to track the sun's movement.

Figure 8:
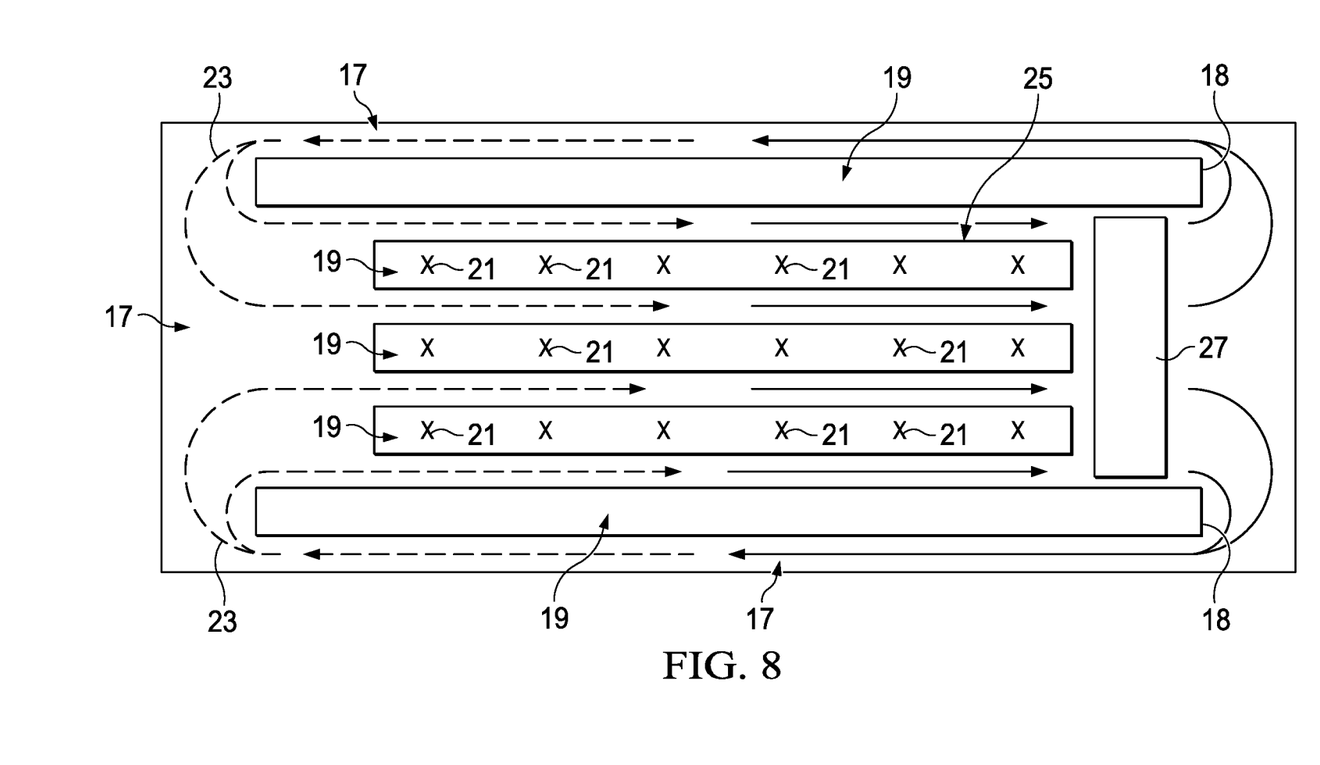
FIG. 8 is a top sectional view of another exemplary VTU.

FIG. 8 illustrates a top sectional view of the VTU 10. The VTU 10 comprise one or more cooling pathways. Such cooling pathways may comprise openings configured to ingest and exhaust ambient air 21 into and out of one or more open loop pathways 19. In exemplary embodiments, the open loop pathways may pass along backlights for the electronic displays 18. Such cooling pathways may include, additionally or alternatively, closed loop pathways 17 located entirely within the VTU 10 for circulating gas 23. In exemplary embodiments, the closed loop pathways 17 may encircle the electronic display(s) 18 by passing through a gap between the transparent cover panel and the electronic display 18 of a given side assembly 22. Further, various components may be positioned within either one of the closed loop and the open loop pathways 17, 19. For example, one or more electronic components for operating the VTU 10 may be provided within or along the closed loop pathways 17. One or more fans may be provided within or along the open loop pathways 19 to force ambient air therethrough. One or more fans 27 may be provided within or along the closed loop pathways 17 to force circulating gas therethrough. A heat exchanger 25 may be provided, preferably behind the electronic display(s) 18, to permit heat transfer between the relatively warm circulating gas 23 in the closed loop pathways 17 and the relatively cool ambient air 21 in the open loop pathways 19.

Figure 9:
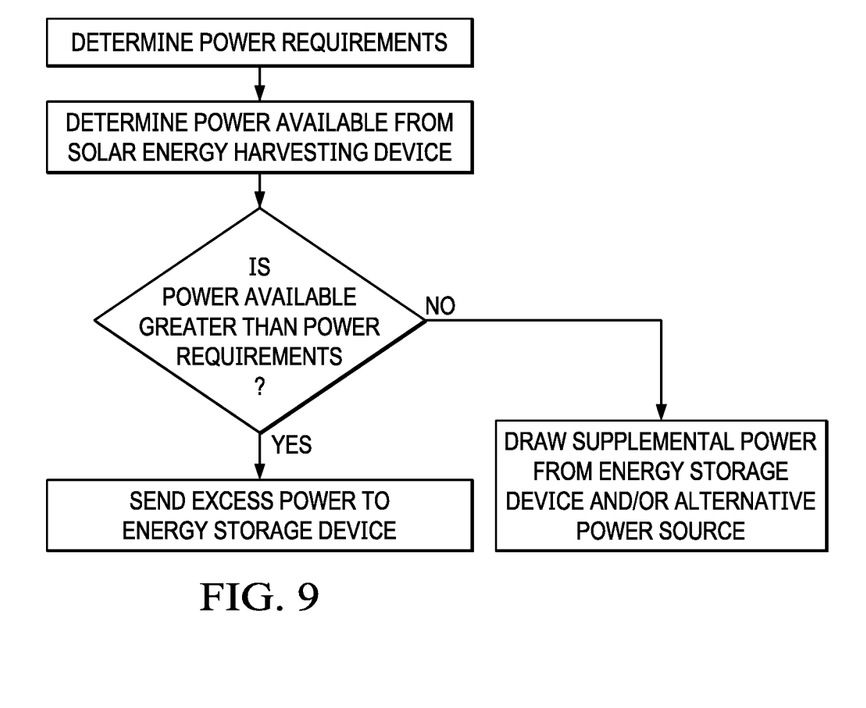
FIG. 9 is a flowchart with exemplary logic for operating the VTU of FIGS. 1-8.

FIG. 9 provides a flowchart with exemplary logic for operating the VTU 10 and related components. The controller 42 may determine the amount of power needed to operate the VTU 10. This determination may be made, at least in part, based on readings from the sensors 11, operational data from the VTU 10, historical information, predictions, some combination thereof, or the like. During sufficiently sunny conditions, the controller 42 may be configured to direct power collected from the solar energy harvesting device 24 to the VTU 10. If excess energy is collected, the controller 42 may be configured to direct such excess power to the one or more energy storage devices 38. If insufficient energy is provided from the solar energy harvesting device 24, such as during nighttime or cloudy conditions, the controller 42 may be configured to direct energy from the one or more energy storage devices 38 and/or the energy sources 40 to VTU 10. In this way, the VTU 10 may be periodically, or continuously, powered by the solar energy harvesting device 24. For certain vehicles 12, this may result in improved gas mileage, though such is not required.

The controller 42 may be configured to monitor electrical draw from the VTU 10. The controller 42 may, alternatively or additionally, be configured to monitor electrical production from the solar energy harvesting device 24. Electrical draw and production may be monitored in the form of one or more of the following: current, wattage, voltage, some combination thereof, or the like. The controller 42 may, alternatively or additionally, be configured to monitor one or more of the following: ambient lighting conditions (by way of one or more ambient light sensors 11), forecasted weather conditions (by way of network accessible weather data accessed by way of a network connectivity device 15), current or forecasted electrical billing rates (by way of network accessible rate data accessed by way of a network connectivity device 15), user preferences (received by way of the network connectivity device 15), some combination thereof, or the like. In utilizing such information, the controller 42 may be configured to determine which energy source(s) 40 to draw from.

In exemplary embodiments, the electrical systems may be entirely direct current ("DC"). For example, without limitation, the VTU 10, the solar energy harvesting devices, the energy storage devices 38, the energy sources 40, the controller 42, some combination thereof, or the like may be configured to operate solely using DC power. The components and power utilized herein may, in exemplary embodiments without limitation, exclusively utilize direct current power such that no AC-DC or DC-AC inverters or the like are required.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may be personal computers, smartphones, tablets, databases, servers, or the like. The electronic connections described herein may be accomplished by wired or wireless means.

What is claimed is:
1. A solar powered vehicle topper unit ("VTU") comprising:
   an electronic display;
   a housing for said electronic display;
   a solar energy harvesting device electrically connected to said electronic display; and a support extending between said housing and said solar energy harvesting device such that a bottom surface of said solar energy harvesting device is located above, and spaced apart from, a top surface of said housing to secure said solar energy harvesting device in an elevated position;

wherein said solar energy harvesting device has a first footprint, said housing has a second footprint which is smaller than said first footprint.

2. The solar powered VTU of claim 1 further comprising:
an energy storage device electrically connected to said electronic display and said solar energy harvesting device.

3. The solar powered VTU of claim 2 wherein:
said energy storage device comprises a vehicle battery.

4. The solar powered VTU of claim 3 wherein:
said vehicle comprises an electric propulsion system.

5. The solar powered VTU of claim 3 wherein:
said vehicle comprises an internal combustion engine and an alternator electrically connected to said vehicle battery.

6. The solar powered VTU of claim 1 further comprising:
a mounting device extending between said housing and the roof of the vehicle.

7. The solar powered VTU of claim 6 wherein:
said mounting device comprises a first crossbar and a second crossbar spaced apart from said first crossbar.

8. The solar powered VTU of claim 1 wherein:
said solar energy harvesting device is located directly above said housing such that said first footprint overlies said second footprint.

9. The solar powered VTU of claim 8 wherein:
said solar energy harvesting device has a maximum width dimension which is larger than a maximum width dimension for said housing.

10. The solar powered VTU of claim 9 wherein:
said solar energy harvesting device has a maximum length dimension which is larger than a maximum length dimension for said housing.

11. The solar powered VTU of claim 3 wherein:
said solar energy harvesting device is configured to provide direct current ("DC") power; and
said electronic display is configured to operate using DC power.

12. The solar powered VTU of claim 11 further comprising:
a second electronic display positioned back to back with said electronic display within said housing.

13. The solar powered VTU of claim 12 further comprising:
an open loop pathway for ambient air through said housing.

14. The solar powered VTU of claim 13 further comprising:
a closed loop pathway for circulating gas within said housing; and
a heat exchanger, wherein said open loop pathway comprises a first portion of said heat exchanger, and wherein said closed loop pathway comprises a second portion of said heat exchanger.

15. The solar powered VTU of claim 14 further comprising:
a fan placed within said closed loop pathway, wherein said fan is electrically connected to said solar energy harvesting device and is configured to operating using DC power.

16. The solar powered VTU of claim 13 further comprising:
a controller electrically interposed between said vehicle battery, said solar energy harvesting device, and said electronic display, wherein said controller comprises one or more processors and one or more electronic storage devices comprising executable software instructions, which when executed by said one or more processors, configures said one or more processors to:
determine a power requirement for operations;
draw available DC power from the solar energy harvesting device;
draw supplemental DC power from the battery where the available DC power generated by the solar energy harvesting device is below the power requirement; and
charge the vehicle battery with at least some of the available DC power generated by the solar energy harvesting device where the available DC power exceeds the power requirement.

17. A method for providing solar power to a vehicle topper unit ("VTU"), said method comprising:
securing a solar panel in an elevated position directly above a housing comprising a first and second electronic display;
mounting said housing to a roof rack secured to a roof of a vehicle;
electrically connecting said solar panel to said electronic display;
operating said vehicle on public roadways; and
passing direct current from said solar panel to said electronic display;
wherein said solar panel has a first footprint which is larger than, and overlies, a second footprint of said housing such that shade is at least periodically cast on said first and second electronic displays during daytime hours.

18. The method of claim 17 further comprising:
electrically connecting said first and second electronic displays to a battery for said vehicle;
electrically interposing a controller between said battery and said electronic display;
drawing direct current ("DC") power from said battery when power supplied by said solar panel is below a threshold; and
charging said battery with DC power supplied by said solar panel when power supplied by said solar panel exceeds the threshold.

19. The method of claim 18 further comprising:
electrically connecting a fan within said housing to said solar panel; and
operating said fan with DC power supplied by said solar panel.

20. A system for providing solar power to a vehicle topper unit ("VTU"), said system comprising:
a first crossbar mounted to a roof of a vehicle at a first location;
a second crossbar mounted to the roof of the vehicle at a second location spaced apart from the first location;
a housing having an upper surface, wherein a proximal portion of said housing is secured to said first crossbar and a distal portion of said housing is secured to said second crossbar;
a first electronic display located within said housing;
a second electronic display located within said housing in a back-to-back arrangement with said first electronic display;

a cooling system located at least partially within said housing and configured to cool the first electronic display and the second electronic display when operated;

a solar energy harvesting device comprising a substrate and a plurality of photovoltaic cells arranged on said substrate, wherein said solar energy harvesting device is electrically connected to said first electronic display, said second electronic display, and said cooling system, and wherein said solar energy harvesting device is configured to generate direct current ("DC") power when exposed to sunny conditions;

a plurality of supports extending between said housing and said solar energy harvesting device such that said substrate is elevated directly above, and spaced apart from, the upper surface of said housing;

a battery for said vehicle electrically connected to said first electronic display, said second electronic display, and said cooling system, where said battery is configured to supply and receive DC power; and a controller electrically interposed between said battery, said solar energy harvesting device, said first electronic display, said second electronic display, and said cooling system, wherein said controller comprises executable software instructions stored at one or more electronic storage devices, which when executed, configures one or more processors to:
  determine an amount of power required to operate at least the first electronic display, the second electronic display, and the cooling system;
  draw DC power from the battery where the DC power generated by the solar energy harvesting device is below the amount; and
  charge the battery with at least some of the DC power generated by the solar energy harvesting device where the DC power generated by the solar energy harvesting device exceeds the amount;

wherein said solar energy harvesting device has maximum width which is larger than a maximum width of said housing;

wherein said solar energy harvesting device has maximum length which is larger than a maximum length of said housing.

* * * * *